(12) United States Patent
Brech et al.

(10) Patent No.: US 12,230,689 B2
(45) Date of Patent: Feb. 18, 2025

(54) SEMICONDUCTOR DEVICE AND METHOD FOR FABRICATING A SEMICONDUCTOR WAFER

(71) Applicant: Infineon Technologies AG, Neubiberg (DE)

(72) Inventors: Helmut Brech, Lappersdorf (DE); Albert Birner, Regensburg (DE); John Twynam, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 441 days.

(21) Appl. No.: 17/145,507

(22) Filed: Jan. 11, 2021

(65) Prior Publication Data

US 2021/0226039 A1 Jul. 22, 2021

(30) Foreign Application Priority Data

Jan. 20, 2020 (EP) ..................... 20152742

(51) Int. Cl.
*H01L 29/66* (2006.01)
*H01L 21/02* (2006.01)
*H01L 21/78* (2006.01)
*H01L 29/20* (2006.01)
*H01L 29/205* (2006.01)
*H01L 29/417* (2006.01)
*H01L 29/778* (2006.01)

(52) U.S. Cl.
CPC .. *H01L 29/66462* (2013.01); *H01L 21/02381* (2013.01); *H01L 21/0254* (2013.01); *H01L 21/7806* (2013.01); *H01L 29/2003* (2013.01); *H01L 29/205* (2013.01); *H01L 29/41758* (2013.01); *H01L 29/7786* (2013.01)

(58) Field of Classification Search
None
See application file for complete search history.

(56) References Cited

U.S. PATENT DOCUMENTS

| 2011/0291242 | A1 | 12/2011 | Soma | |
| 2015/0060942 | A1* | 3/2015 | Kume | H01L 29/41758 257/190 |
| 2017/0053873 | A1 | 2/2017 | Zhu | |
| 2017/0338153 | A1 | 11/2017 | Baumgartl et al. | |
| 2018/0083107 | A1* | 3/2018 | Birner | H01L 21/304 |

FOREIGN PATENT DOCUMENTS

EP 3300100 A1 3/2018

* cited by examiner

*Primary Examiner* — Jack S Chen
(74) *Attorney, Agent, or Firm* — Murphy, Bilak & Homiller, PLLC

(57) ABSTRACT

In an embodiment, a method for fabricating a semiconductor wafer includes: epitaxially growing a III-V semiconductor on a first surface of a foreign wafer having a thickness $t_w$, the first surface being capable of supporting the epitaxial growth of at least one III-V semiconductor layer, the wafer having a second surface opposing the first surface; removing portions of the III-V semiconductor to produce a plurality of mesas including the III-V semiconductor arranged on the first surface of the wafer; applying an insulation layer to regions of the wafer arranged between the mesas; and progressively removing portions of the second surface of the wafer, exposing the insulation layer in regions adjacent the mesas and producing a worked second surface.

10 Claims, 13 Drawing Sheets

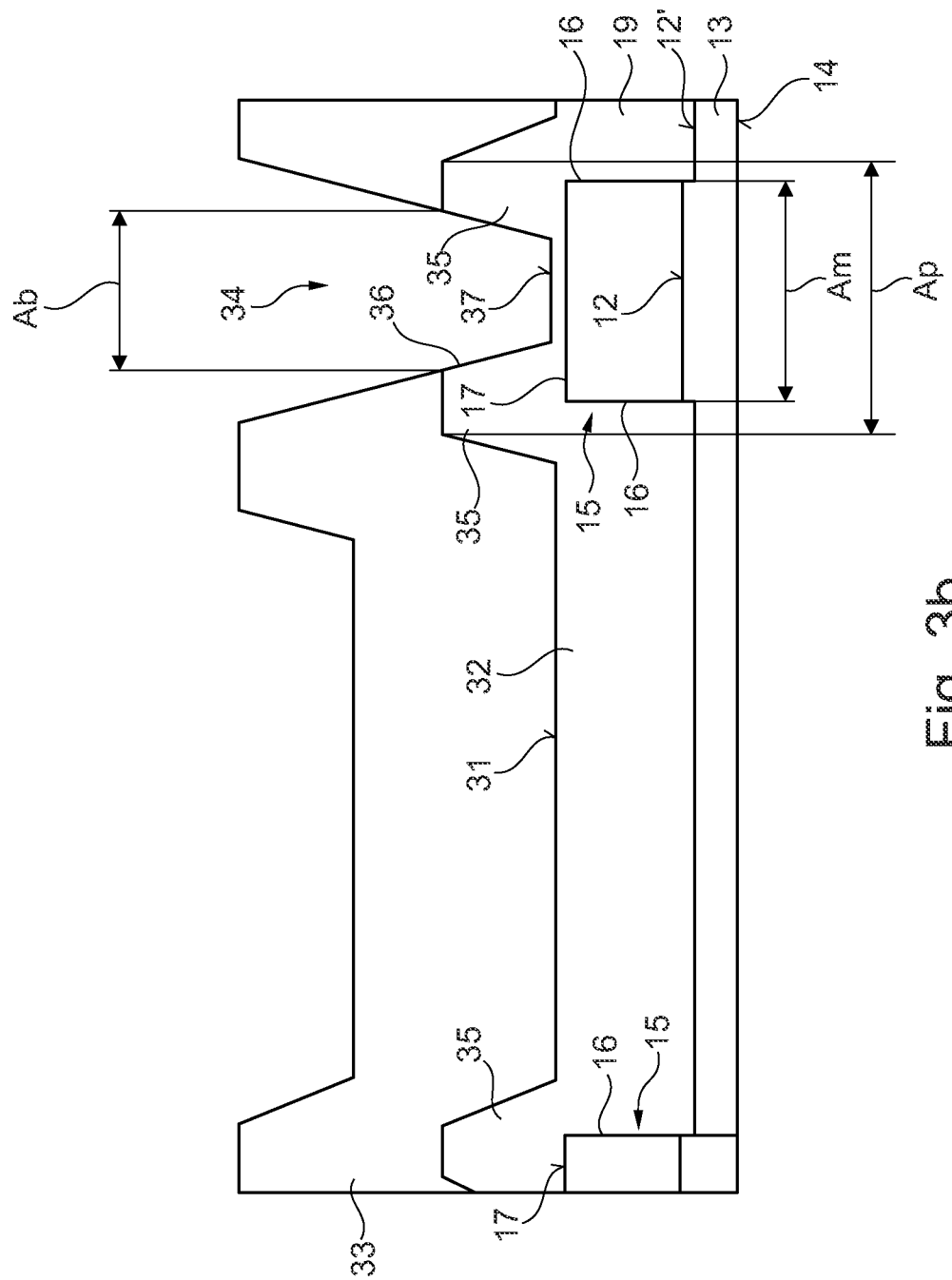

SEMICONDUCTOR DEVICE AND METHOD FOR FABRICATING A SEMICONDUCTOR WAFER

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times. However, further improvements are desirable.

SUMMARY

According to the invention, a method for fabricating a semiconductor wafer comprises epitaxially growing a III-V semiconductor on a first surface of a foreign wafer having a thickness $t_w$, the first surface being capable of supporting the epitaxial growth of at least one III-V semiconductor layer, the wafer having a second surface opposing the first surface, removing portions of the III-V semiconductor to produce a plurality of mesas comprising the III-V semiconductor arranged on the first surface of the foreign wafer, applying an insulation layer to regions of the foreign wafer arranged between the mesas and progressively removing portions of the second surface of the foreign wafer, exposing the insulation layer in regions adjacent the mesas and producing a worked second surface.

In some embodiments, the method further comprises removing portions of the first surface of the foreign wafer to form a worked first surface in regions laterally adjacent the mesa and to form an interface between the first surface of the foreign wafer and the III-V semiconductor structure that extends across the width of the mesa.

In some embodiments, the progressively removing portions of the second surface of the foreign wafer comprises reducing the thickness $t_w$ of the foreign wafer under the mesa to a thickness t, wherein t≤20 µm, or t 2 µm or t≤1 µm. In some embodiments, t=0. In some embodiments, 0 µm<t≤20 µm, or 0 µm<t≤2 µm or 0 µm<t≤1 µm.

In some embodiments, the removing portions of the second surface of the wafer comprises at least one selected from the group consisting of grinding, polishing, chemical mechanical polishing and etching the second surface of the wafer.

In some embodiments, the applying an insulation layer comprises depositing the insulation layer onto the mesa and regions between the mesas such that the insulation layer has a thickness that is at least as great as a height of the mesas and the mesas are covered with the insulating layer and planarising the insulation layer and forming a planarised surface comprising an upper surface of the mesa and an upper surface of the insulating layer.

In some embodiments, the method further comprises forming a structured mask on the insulating layer having an opening above the mesa, the opening having a lateral area smaller than a lateral area of the mesa, removing a portion of the insulating layer within the opening and reducing a thickness of the portion of the insulating layer arranged above the mesa and progressively removing the mask and portions of the insulating layer to produce the planarised surface comprising the upper surface of the mesa and the upper surface of the insulating layer.

In some embodiments, the method further comprises forming a stop layer on the regions of the wafer arranged between the mesas and, optionally, on side faces of mesas and the removing portions of the second surface of the wafer comprises exposing the stop layer in regions adjacent the mesas.

In some embodiments, the stop layer comprises carbon or amorphous hydrogenated carbon.

In some embodiments, the method further comprises forming a cavity laterally adjacent a side face of the mesa.

In some embodiments, the method further comprises forming a metallization structure on the III-V semiconductor, the metallization structure providing a source, gate and drain for a transistor structure.

In some embodiments, the metallization structure comprises a source finger, a gate finger and a drain finger arranged on a top surface of each mesa. Each mesa may provide a separate transistor device. The source finger, the gate finger and the drain finger may each comprise one or more metal layers and may each have an elongate form, for example a strip. The source finger, the gate finger and the drain finger may extend substantially parallel to one another.

In some embodiments, the metallization structure further comprises a source bus that electrically couples a first source finger arranged on a first mesa with a second source finger arranged on a second mesa, a drain bus that electrically couples a first drain finger arranged on the first mesa with a second drain finger arranged on the second mesa and a gate bus or gate runner that electrically couples a first gate finger arranged on the first mesa with a second gate finger arranged on a second mesa.

Two or more of the plurality of mesas are electrically coupled together by way of the source bus, drain bus and gate bus to form a single transistor device. In some embodiments, the source bus, the drain bus and the gate bus are arranged at least partially on the insulation layer.

In some embodiments, more than one source finger and/or more than one drain finger and/or more than one gate finger may be arranged on each mesa. For example, the fingers on an individual mesa may have a mirror symmetrical arrangement of source, gate, drain, gate, source or drain, gate, source, gate, drain.

In some embodiments, the metallization structure comprises a gate finger and a drain finger arranged on each mesa, a drain bus that electrically couples a first drain finger arranged on the first mesa with a second drain finger arranged on the second mesa, the drain bus being arranged laterally adjacent the first mesa and the second mesa at least partially on the insulating layer, and a gate bus that electrically couples a first gate finger arranged on the first mesa with a second gate finger arranged on a second mesa, the gate bus being arranged laterally adjacent the first mesa and the second mesa at least partially on the insulating layer.

In some embodiments the drain bus is arranged laterally adjacent a first side of the first mesa and the second mesa and the gate bus is arranged laterally adjacent a second side of the first mesa and the second mesa, the second side opposing the first side.

In some embodiments, the metallization structure further comprises at least one source via positioned in the insulating layer between the first mesa and the second mesa.

The at least one source via may be electrically coupled to a source region arranged on the insulating layer that extends between the first mesa and the second mesa and to a metallic layer on the worked second surface.

The source region may extend between sides of the mesas that extend perpendicularly to the first side and second side adjacent which the drain bus and gate bus are positioned.

In some embodiments, the metallic layer on the worked second surface may extend over the entire worked second surface continuously and uninterruptedly. In some embodiments, the metallic layer comprises a plurality of discrete regions arranged on the worked second surface. The source via or vias positioned between a pair of mesas may be coupled to a single one or the discrete regions.

In some embodiments, the III-V semiconductor is a Group III nitride and the foreign wafer is monocrystalline silicon.

In some embodiments, the method further comprises forming a parasitic channel suppression region at the interface between the III-V semiconductor and the first surface, wherein the parasitic channel suppression region comprises an amorphous layer or a polycrystalline layer or a high-defect density region.

In some embodiments, the forming a parasitic channel suppression region comprises implanting species into the first surface of the wafer and afterwards epitaxially growing the III-V semiconductor on the first surface, or implanting species into the worked second surface of the wafer.

In some embodiments, the species comprise at least one selected from the group consisting of Ar, Kr, Xe, Ne, He, N, O, H, Fe, C, Si and Al. The species may be ions.

In some embodiments, the implanting species comprises implanting species at two or more different energies.

According to the invention, a semiconductor device is provided that comprises a plurality of mesas, each mesa comprising a III-V semiconductor, an insulating matrix having an upper surface and a lower surface, wherein side faces of the mesas are embedded in the insulating matrix and a top surface of the mesa is substantially coplanar with the upper surface of the insulating matrix and a metallization structure. The metallization structure comprises a gate finger and a drain finger arranged on the top surface of each mesa, a drain bus that electrically couples a first drain finger arranged on the first mesa with a second drain finger arranged on the second mesa, and a gate bus that electrically couples a first gate finger arranged on the first mesa with a second gate finger arranged on a second mesa.

In some embodiments, the III-V semiconductor comprises an epitaxial Group III nitride-based multi-layer structure.

In some embodiments, the drain bus and the gate bus are at least partially arranged on the upper surface of the insulating matrix.

In some embodiments, the metallization structure further comprises a source region arranged on the insulating layer and extending between the first mesa and the second mesa. The source region may be formed of a conductive layer such as a metallic layer.

In some embodiments, the metallization structure further comprises a source via extending through the insulating matrix, the source via being electrically coupled to the source region, and a metallic layer on the lower surface of the insulating layer.

In some embodiments, the metallic layer entirely covers a rear surface of the semiconductor device, or the metallic layer comprises a plurality of discrete regions arranged on the rear surface of the semiconductor device.

In some embodiments the drain bus is arranged laterally adjacent a first side of the first mesa and the second mesa and the gate bus is arranged laterally adjacent a second side of the first mesa and the second mesa, the second side opposing the first side.

The source region may extend between sides of the mesas that extend perpendicularly to the first side and second side adjacent which the drain bus and gate bus are positioned.

In some embodiments, the metallization structure comprises a source bus, and the source bus, the drain bus and the gate bus are arranged laterally adjacent to side faces of the mesas and on the upper surface of the insulating matrix.

In some embodiments, the metallization structure comprises source fingers arranged on the top surface of each mesa and the source fingers, gate fingers and drain fingers are positioned on the top surface of the mesas and on the upper surface of the insulating matrix and extend into the respective source bus, gate bus and drain bus.

The mesas may be arranged in one or more rows or in an array of rows and columns, for example.

In some embodiments, the semiconductor device further comprises a support layer having a first surface capable of supporting the epitaxial growth of at least one Group III nitride and a second surface opposing the first surface, the mesa being arranged on the first surface, the second surface being coplanar with a lower surface of the insulating matrix.

In some embodiments, a lower surface of the mesa is substantially coplanar with the lower surface of the insulating matrix. In these embodiments, the mesa may have been epitaxially grown on a support layer that has subsequently been completed removed and does not form a part of the final semiconductor device.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 3a to 3c illustrate a method for planarising a semiconductor wafer which may be used in the methods illustrated in FIGS. 1a-1e and 2a-2d.

DETAILED DESCRIPTION

Figure 1A:
FIGS. 1a to 1e illustrate a method of fabricating a semiconductor wafer according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

In some III-V semiconductor devices, a III-V semiconductor multilayer structure is epitaxially grown on a support substrate comprising a different material, which may also be referred to as a foreign substrate. In some embodiments, the substrate is a wafer. The III-V semiconductor multilayer structure is patterned to form a plurality of discrete mesas that are spaced from one another by regions of the support substrate. These regions of the support substrate may be filled with insulation material, for example an oxide or a nitride, that may form a substantially coplanar surface with the upper surface of the mesa. One or more devices, for example a transistor device, are formed in some or all of the mesas on the support substrate. The insulating material may also be used to reduce substrate or wafer bow which may be caused by compressive or tensile stress resulting from the difference in lattice parameter between the III-V semiconductor and the support substrate. The resulting structure may be called a composite wafer.

FIGS. 1a to 1e illustrate a method of fabricating a semiconductor wafer 10 according to an embodiment. FIG. 1a illustrates the epitaxial growth of a III-V semiconductor 11 on a first surface 12 of a foreign wafer 13 having a thickness $t_w$. The first surface 12 of the foreign wafer 13 is capable of supporting the epitaxial growth of at least one III-V semiconductor layer. The foreign wafer has a second surface 14 opposing the first surface 12.

As used herein, the term "foreign" wafer indicates a wafer formed of a material that is different from a III-V semiconductor. For example, the foreign wafer 11 may include may comprise silicon and may be formed of a monocrystalline silicon wafer or an epitaxial silicon layer formed on a further substrate. The III-V semiconductor may be gallium arsenide or gallium nitride-based for example.

Figure 6:
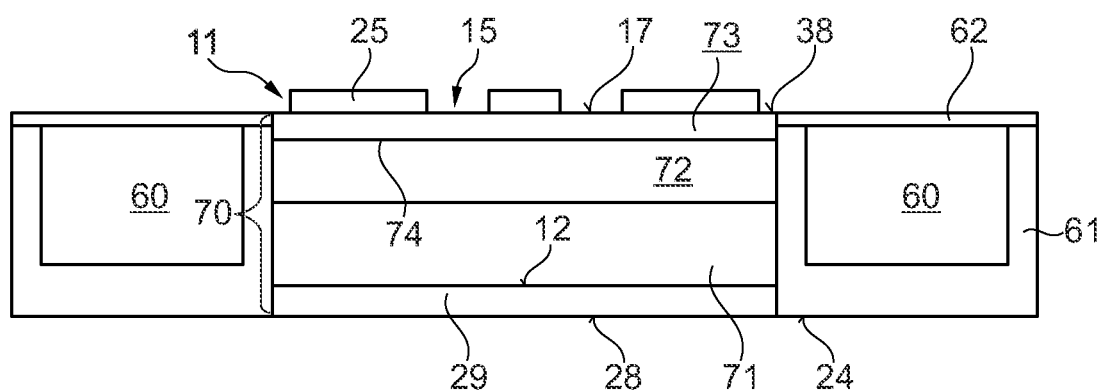
FIG. 6 illustrates a cross-sectional view of a portion of a semiconductor wafer according to an embodiment.

The III-V semiconductor 11 may include one or more layers which may have the same or differing compositions. In some embodiments, for example, the III-V semiconductor is a Group III nitride-based semiconductor. In some embodiments, the III-V semiconductor 11 includes a multilayer stack formed of Group III nitride layers having differing compositions. An example of a multilayer stack which may be epitaxially grown on the first surface 12 is illustrated in FIG. 6.

The foreign wafer 13 may have a diameter of six inches or eight inches and may have a thickness of 250 μm. The III-V semiconductor 11 is epitaxially grown over the first surface 12 of the semiconductor wafer 13 to form a continuous uninterrupted layer.

Figure 1B:
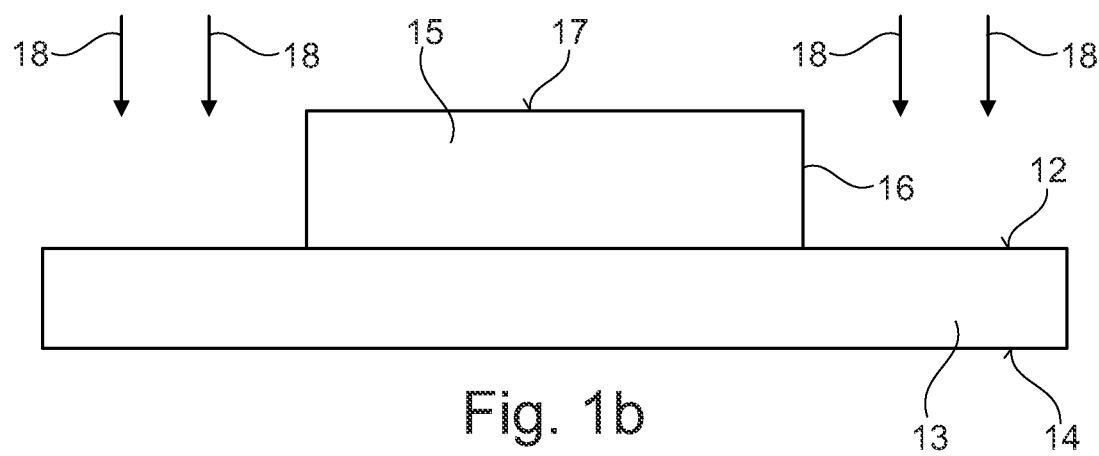

As illustrated in FIG. 1b, portions of the III-V semiconductor 11 are removed, as is indicated schematically by the arrows 18 in FIG. 1b, to form a plurality of mesas 15, of which one mesa 15 is illustrated in FIGS. 1a to 1e, comprising III-V semiconductor that are arranged on the first surface 12 of the foreign wafer 13 and spaced apart from one another by regions of the first surface 12 which may be called non-device regions. After formation of the mesas the first surface 12 remains substantially planar in this embodiment. The mesas 15 each include side faces 16 and a top face 17 and are positioned spaced apart from one each other another on the first surface 12. The mesas 15 can be considered to protrude from the first surface 12 of the wafer 13.

Figure 1C:
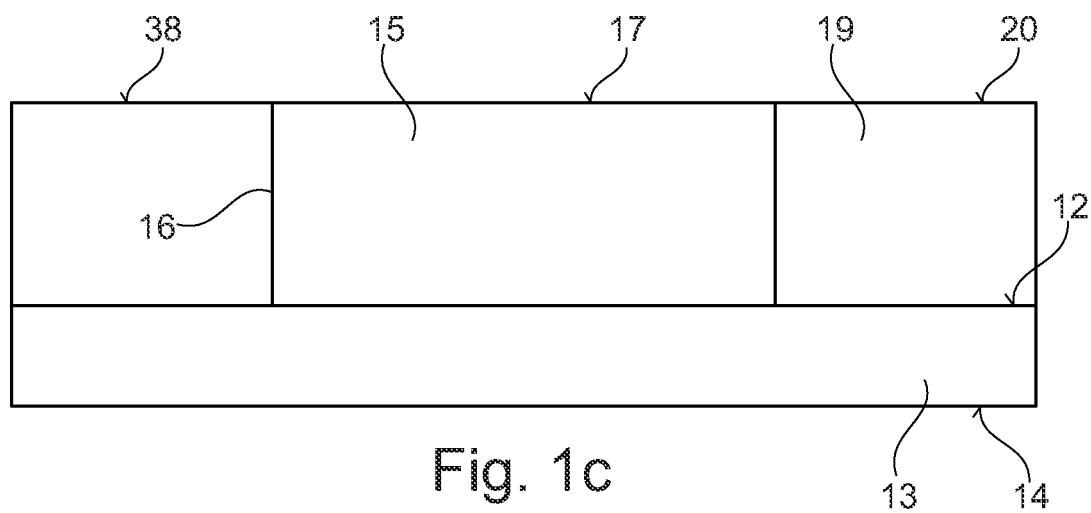

FIG. 1c illustrates applying an insulation layer 19 to regions of the first surface 12 of the foreign wafer 13 that are arranged between the mesas 15, i.e., to the non-device regions of the first surface 12. At least the side faces 16 of the mesas 15 are embedded in the insulating layer 19. The insulating layer 19 has a top surface 20 which is substantially coplanar with the top face 17 of the mesas 15. The mesas 15 are therefore embedded in, and entirely laterally surrounded by, the insulating layer 19. The insulating layer 19 may include an oxide and/or a nitride and may include one or more sublayers. At this stage in the method, a composite layer including lateral regions of differing composition, ie. The III-V semiconductor material of the mesas 15 and the insulating material of the layer 19, is formed on the first surface 12 of the wafer 13.

Figure 1D:
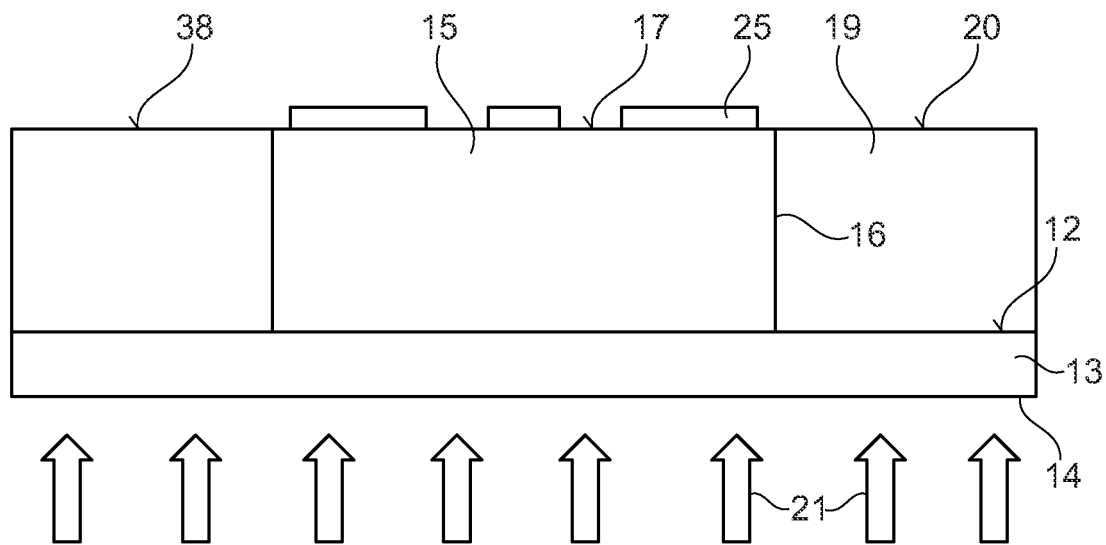

As is illustrated in FIG. 1d, portions of the second surface 14 of the wafer 13 are then progressively removed as is indicated schematically by the arrows 21. The portions of the second surface 14 of the wafer 13 may be removed by one or more of grinding, polishing, chemical mechanical polishing and etching. A carrier substrate or wafer may be applied to the first sides, i.e., the mesas 15 and insulating layer 19, and used as a support during the removal of the second surface 14. As illustrated in FIG. 1d, the insulation layer 19 is exposed in regions adjacent the mesas 15 to produce a worked second surface which comprises islands of the III-V material of the mesas 15 and surrounded by portions of the insulating layer 19. The worked second surface can be considered to be coplanar surface 24 including areas formed by the lower surface 22 of the mesas 15 and the lower surface 23 of the insulating layer 19.

Figure 1E:
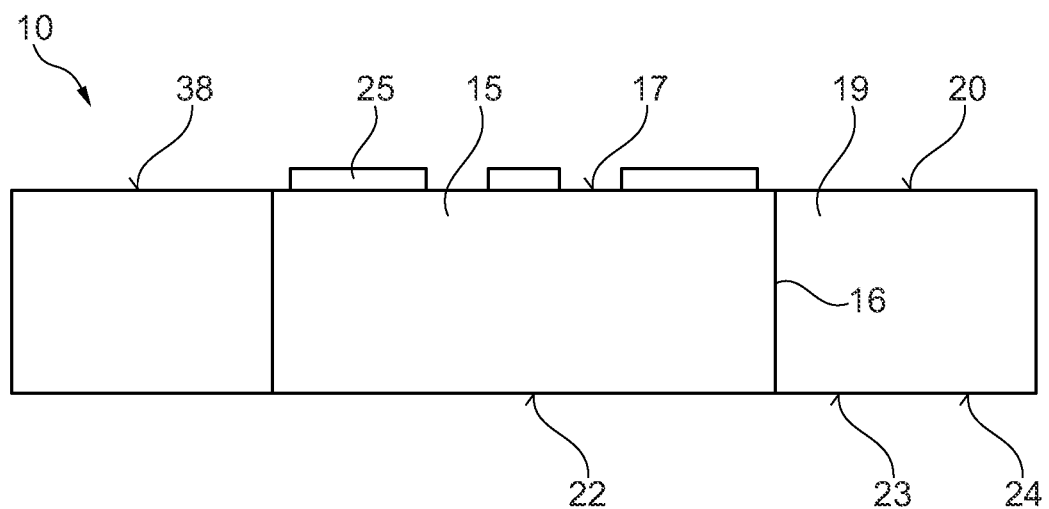

In the embodiment illustrated in FIG. 1e, the semiconductor substrate 13 has been completely removed such that its thickness $t_w$ is progressively reduced to 0 across the entire lateral area. The structure produced can be considered to be a composite wafer 10 comprising islands of III-V material, provided by the mesas 15, extending from an upper surface 38 to a lower surface 24 of the composite wafer 10 which have side faces 16 embedded within a matrix formed by the insulating layer 19. The matrix has upper and lower surfaces 20, 23 which are substantially coplanar with the upper and lower surfaces of the mesa 15 to form a substantially planar composite wafer 10.

In some embodiments, before the progressive removal of portions of the second surface 14 of the wafer 13, semiconductor devices may be formed within the mesas 15. In some embodiments, one or more electrodes 25 may be formed on the upper surface 17 of the mesas 15. For example, each of the mesas may provide a transistor device and include source, gate and drain electrodes on the top face 17. In some embodiments, two or more mesas 15 may together form a semiconductor device. A conductive redistribution structure may be provided which extends over the top face 20 of the insulating layer 19 and also on the top face 17 of the mesas 15.

FIGS. 2a to 2d illustrate a method of fabricating a semiconductor wafer 10 according to an embodiment.

In the method illustrated in FIGS. 2a to 2d, a III-V semiconductor 11 is epitaxially grown on the first surface 12 of the foreign wafer 13 as illustrated in FIG. 1a. Portions of the III-V semiconductor 11 are removed as indicated by the arrows 18 to produce a plurality of mesas 15 comprising the III-V semiconductor 11 that are positioned on the first surface 12 of the foreign wafer 13 spaced apart from one another by portions of the first surface 12. In the embodiment illustrated in FIGS. 2a to 2d, after the III-V semiconductor 11 has been removed from regions of the first surface 12 to produce mesas solely comprising III-V material that protrude from the first surface 12 of the foreign wafer 13, the removal process is continued and portions of the wafer 13 are also removed in order to form a worked first surface 12' in regions laterally adjacent the mesas 15, i.e., in the non-device regions. The first surface 12 the wafer 13 therefore includes protruding regions having a thickness $t_w$ which are capped by III-V semiconductor 11 and indentations having a base formed by the new worked first surface 12' and side faces 26 which are substantially vertically aligned with the side faces 16 of the III-V semiconductor material of the mesas 15. An interface 27 between the III-V semiconductor material 11 and the foreign substrate 13 is formed which extends across the width of the mesa 15 and which is positioned in a plane above the plane of the new first surface 12'. In the regions which are positioned laterally adjacent the mesas 15, and are uncovered by the iii-V semiconductor material, the foreign wafer 13 has a thickness $t_r$ which is less than $t_w$.

Figure 2A:
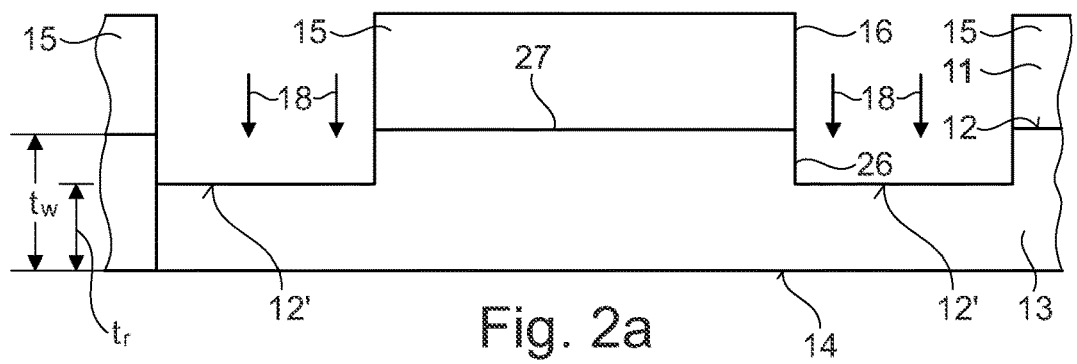
FIGS. 2a to 2d illustrate a method of fabricating a semiconductor wafer according to an embodiment.
Figure 2B:
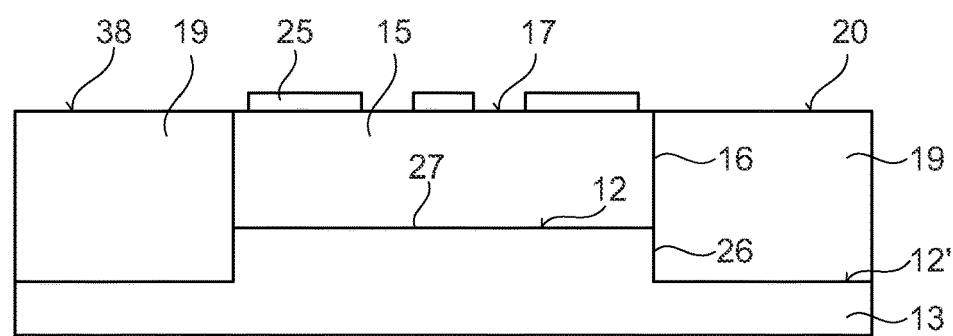

As is illustrated in FIG. 2b, the insulating material 19 is then applied to the regions of the wafer 13 positioned between the mesas 15 such that the indentations in the first surface 12 are filled with the insulating material 19 and the side faces 16 of the mesas 15 in addition to the side faces 26 and base 12' of the indentations are filled with the insulating layer 19. The insulating layer 19 has a top face 20 which is substantially coplanar with the top face 17 of the metres 15. The devices may then be formed in the mesas 15, for example by applying a metallization structure 25 to the top surface 17 of the mesas 15.

Figure 2C:
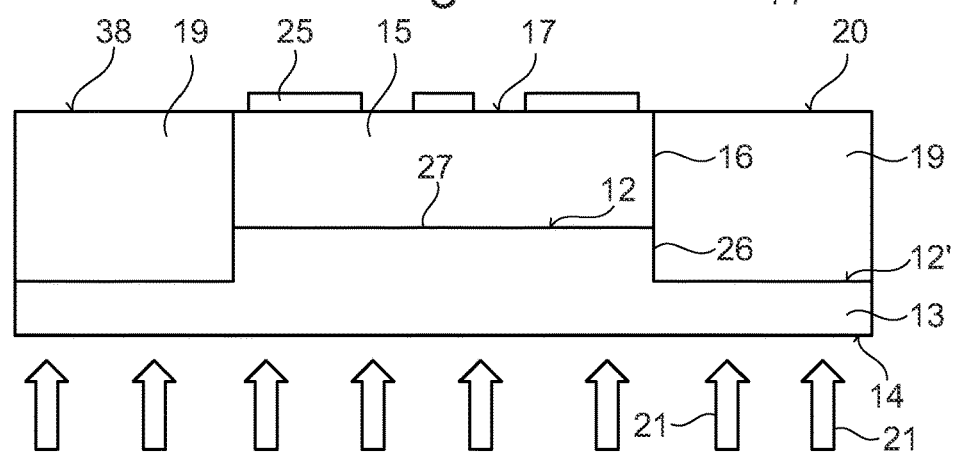

As is illustrated in FIG. 2c, the method continues by progressively removing portions of the second surface 14 of the wafer 13, as indicated schematically by the arrows 21, in order to expose the insulating material 19 in regions laterally adjacent the mesas 15 and to produce a new surface 24. Due to the formation of the indentations 12' in the first surface 12, regions of the first surface 12 of the wafer 13 positioned laterally adjacent the mesas 15 have a reduced thickness $t_r$ compared to the initial thickness $t_w$ of the wafer and the thickness of the wafer 13 under the III-V material of the mesas 15. When the insulating layer 19 is exposed in the new second surface 24, the material of the wafer 13 positioned underneath the III-V material of the mesas 15 remains at the base of the mesas 15 such that the new surface 24 comprises islands 28 formed of the material of the foreign wafer 13, for example silicon, that are laterally surrounded by the exposed surface 23 of the insulating material 19.

In these embodiments, the thickness $t_w$ of the wafer 13 under the mesa 15 is reduced to a thickness t, whereby t is less than 20 µm or less than 2 µm or less than 1 µm. The thickness of the wafer in regions laterally adjacent the mesa 15 is reduced to 0. Since a portion of the wafer remains under the mesa 15, t is greater than 0. This remaining portion of the foreign wafer 13 may have a minimum thickness of, for example, 0.1 µm. In some embodiments, 0 µm<t≤20 µm, or 0 µm<t≤2 µm or 0 µm<t≤1 µm. In some embodiments, 0.1 µm<t≤20 µm, or 0.1 µm<t≤2 µm or 0.1 µm<t≤1 µm.

Figure 2D:
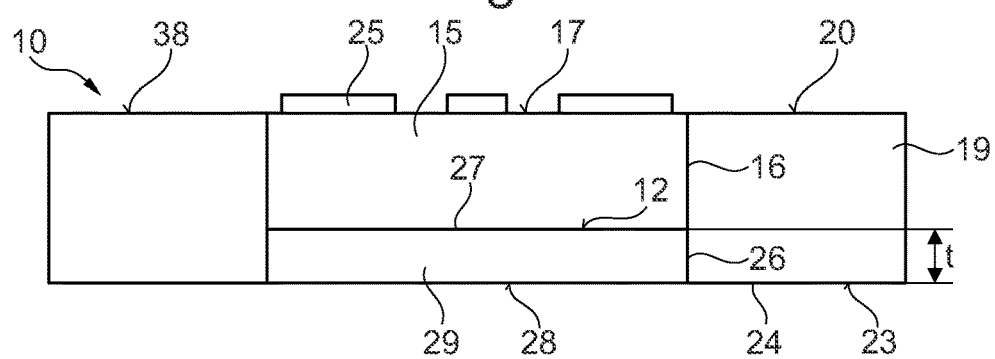

FIG. 2d illustrates a planar composite wafer 10 having a structure including mesas 15 comprising a first base substrate 29 formed by the remaining material of the foreign wafer 13 and a III-V semiconductor layer 11. The mesas 15 are laterally surrounded by insulating material 19 such that the top surface is formed by top surface 17 of an island of III-V material formed by the top surface 17 of the mesa 15 and the top surface 20 of the insulating material 19. The lower surface of the composite wafer comprises islands of the material of the foreign substrate 13 that are laterally surrounded by insulating material 19 forming a substantially coplanar lower surface 24 comprising a lower surface 28 of the mesa 15 which includes the material of foreign substrate rather than III-V semiconductor material and the lower surface 23 of the insulative material 19. The interface 27 formed between the III-V semiconductor layer 11 and the first surface 12 of the foreign substrate extends across the entire width of the mesa 15 and is bounded by the insulating layer 19.

The base substrate 29 provides mechanical support for the III-V semiconductor. The structure illustrated in 2d may be useful for producing a semiconductor device having a lower thermal resistance between the back side of the III-V semiconductor and a further substrate, e.g., a die pad, on which the base substrate 29 is mounted due to the reduced thickness of the base substrate 29. Additionally, this structure may be useful for producing a semiconductor device having through body vias as the thickness of the base substrate 19 through which the vias extend is reduced.

After application of the insulating material 19 to the first surface 12 of the foreign substrate 13 in regions adjacent to the protruding mesas 15, a planarisation process may be carried out form a planar surface comprising the top surface 17 of the mesa 15 and the top surface 20 of the insulating material 19. An embodiment of a method for forming this planar surface is illustrated with reference to FIGS. 3a to 3c.

Figure 3A:
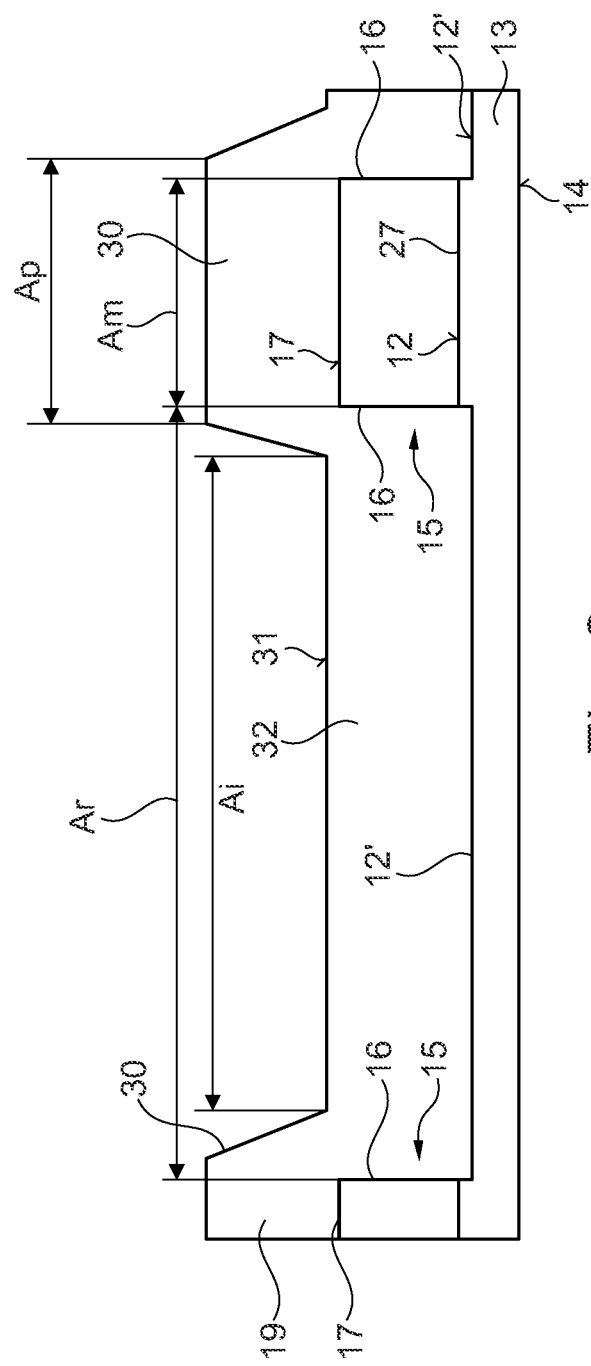
Figure 3C:
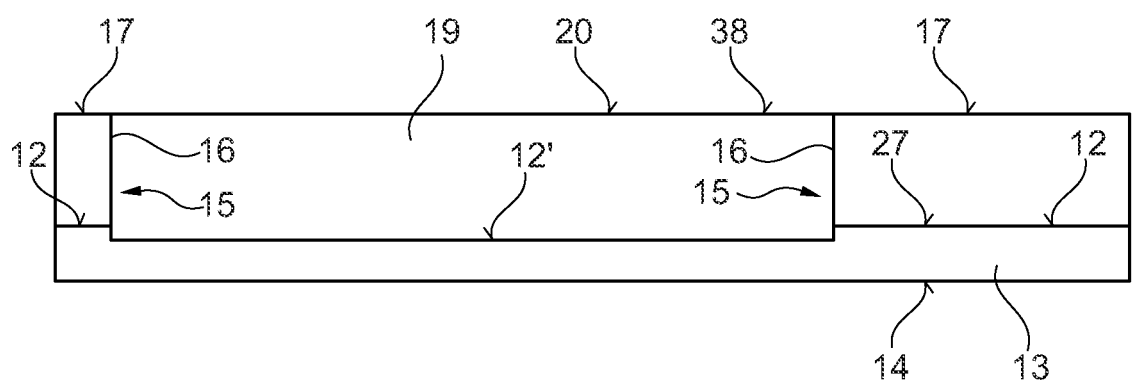

FIGS. 3a to 3c illustrate a method for planarising a semiconductor wafer which may be used in the methods illustrated in FIGS. 1a-1e and 2a-2d. As is illustrated in FIG. 3a, the insulating layer 19 is initially applied to the first surface 12 of the wafer 13 such that it completely covers the mesas 15 as well as the first surface 12 of the wafer 13 in positions between the mesas 15 such that the insulating layer 19 has an outer contour 31 including protrusions 30 positioned above the mesas 15 and indentations 32 positioned in regions between the mesas 15. The edges of the mesas 15 are completely covered by the insulating material 19 and are positioned under the protrusions 30. The protrusions 30 have a lateral area, $A_p$, that is greater than the lateral area, $A_n$, of the mesas 15. The indentations 32 include a lower surface 31 which is positioned in a plane above the plane of the top surface 17 of the mesas 15. The indentations 31 have a lateral area, A, which is smaller than the lateral area, $A_r$, of the region between adjacent mesas 15.

FIG. 3b illustrates a mask 33 that is applied to the initial insulating layer 19 and an opening 34 is formed in the mask 33 at a position above each of the mesas 15. The mask may be a soft mask formed of photoresist or a hard mask. The opening 34 has a lateral area, $A_b$, at its base which is smaller than the lateral area, $A_n$, of the mesa 15. Portions of the insulating material 19 exposed at the base of the opening 34 are removed so as to form an indentation 36 in the insulating layer 19 surrounded by protrusions 35 formed from the insulating material 19. The peripheral edges of the mesa 15 are covered by the thicker portions of the insulating layer provided by the protrusions 35.

The indentation 36 has a base 37 formed by material of the insulating layer 19 so that the top surface 17 of the mesa 15 is still covered by the remaining portion of the insulating layer 19. The base 37 may be positioned in a plane which is similar to the plane in which the base 31 of the indentation 32 is positioned. The mask 33 and the insulating layer 19 are then progressively removed such that the top surface 17 of the mesa 15 is revealed and the thickness of the insulating layer 19 is reduced so that the top surface 20 of the insulating layer 19 in the regions between the mesas 15 is substantially coplanar with the top face 17 of the mesa 15 and a planarized surface 38 is formed as illustrated in FIG. 3c.

The insulating layer 19 is, therefore, removed from regions above the centre part of the mesas 15 in two stages, firstly by forming the indentation 36 in the initial protruding portion 30 of the insulating layer 19 and then by removing the remaining protruding portions 35 which cover the peripheral regions of the mesas 15 and surround the indentations 36 followed by the formation of the planarised composite surface 38 as illustrated in FIG. 3c.

Figure 4:
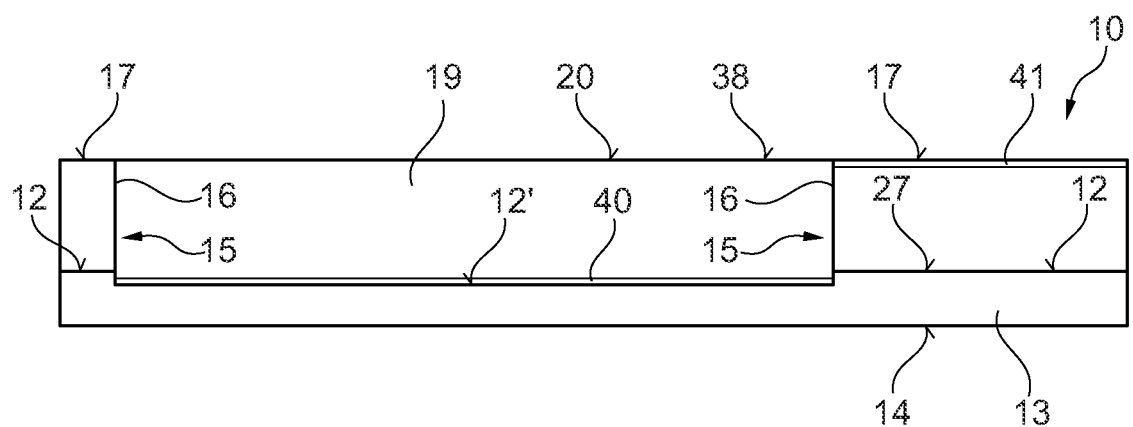
FIG. 4 illustrates a cross-sectional view of a portion of a semiconductor wafer according to an embodiment.

FIG. 4 illustrates an embodiment of the wafer 10, in which, before application of the insulating layer 19, a stop layer 40 is formed on regions of the first surface 12 of the wafer 13 at positions between the mesas 15. In other non-illustrated methods, the stop layer 40 is additionally formed on the side faces 16 of the mesas and, in embodiments in which the mesa 15 includes a base substrate 29, the side faces 26 of the base substrate 29. The insulating layer 19 is then applied according to one of the embodiments described herein. The stop layer 40 acts as a stop layer during the removal of the second surface 14 of the wafer 13. The stop layer 40 may include carbon or amorphous carbon amorphous hydrogenated carbon.

In some embodiments, a stop layer 41 may be applied to the top face 17 of the mesa 15 before the insulating layer 19 is applied. This stop layer 41 acts as a stop layer during the removal of the insulating layer 19 when forming the planarised surface. The stop layer 41 may include carbon or amorphous carbon amorphous hydrogenated carbon.

Figure 5:
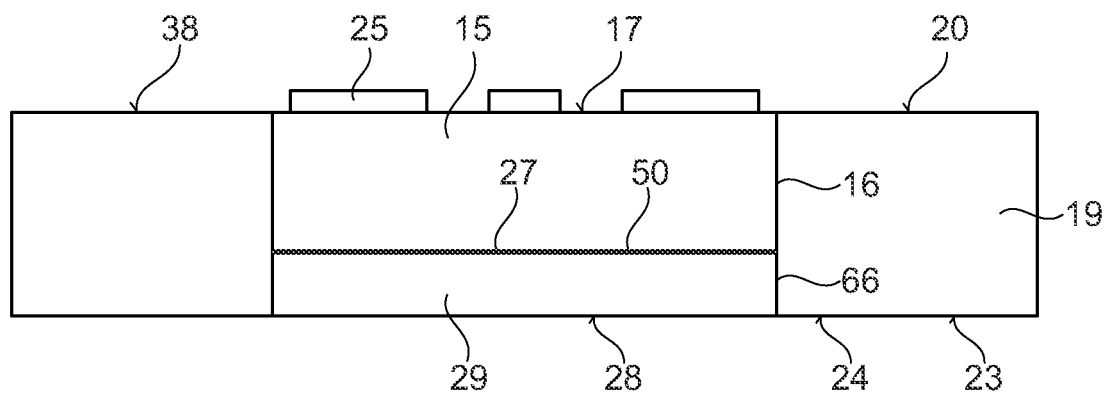
FIG. 5 illustrates a cross-sectional view of a portion of a semiconductor wafer according to an embodiment.

FIG. 5 illustrates an embodiment of a wafer 10, in which the mesas 15 include a base substrate 29. A parasitic channel suppression region 50 is formed at the interface 27 between the III-V semiconductor 11 and the first surface 12 of the foreign substrate 13. The parasitic channel suppression layer 50 has a lateral extent that corresponds to the lateral extent of the mesa 15 and intersects the side faces 16 of the mesa 15. The parasitic channel region 50 may comprise an amorphous layer or polycrystalline layer or a high defect density region or implanted species.

In III-V semiconductor devices, such as GaAs- or GaN-based devices, formed on a foreign substrate such as silicon, a parasitic conductive channel can form at the interface between the substrate and the III-V semiconductor device. Coupling between an electrode of the device, such as a drain electrode in the case of a transistor device, and these parasitic electron or hole channels can lead to losses and limit performance. The parasitic channel suppression region 50 serves to mitigate or eliminate the effects of, or prevent the formation of, such parasitic channels.

The parasitic channel suppression region 50 may have the form of a charge mobility reduction region and/or a charge density reduction region.

The charge mobility reduction region 50 serves to hinder the movement of charges formed at the interface 27 between III-V semiconductor and the first surface 12 of the foreign wafer 13 and consequently to reduce RF losses due to the formation of parasitic conductive channels between the drain electrode 57 and the electrode on the rear of the device.

The effect of these parasitic charge channels can be reduced by providing the parasitic channel suppression region 50 that hinders or suppresses the mobility of charges at the boundary or at the interface between the III-V semiconductor and the foreign substrate.

In some embodiments, a parasitic channel suppression region is provided that is highly resistive so that free charges are prevented or hindered from moving. In these embodiments, the parasitic channel suppression provides a charge mobility reduction region. The charge mobility reduction region may include an amorphous layer or region, a polycrystalline layer or region or a high defect layer or region. The charge mobility reduction region may also include a combination of amorphous and/or polycrystalline portions.

In some embodiments, a parasitic channel suppression region is provided that reduces the charge density by providing a charge density reduction region at the boundary or at the interface between the III-V semiconductor and the foreign substrate. The charge density reduction region may include traps for trapping free charges, thus reducing the charge density and preventing the formation of a parasitic conductive electron or hole channel.

In some embodiments, parasitic channels are suppressed using a combination of charge traps, to reduce the density of free charges, and a highly resistive region to prevent movement of free charges.

In some embodiments, any mobile charge parasitic channels that are present at the III V/substrate interface directly beneath the devices are directly physically interrupted and the charges are compensated by adjusting the composition of the layers positioned on the area of this interface, i.e., above and below the interface.

In some embodiments, the parasitic channel suppression region 50 is formed by implanting species into the first surface 12 of the wafer 13 and then, afterwards, epitaxially growing the III-V semiconductor 11 on the first surface 12.

In other embodiments, the parasitic channel suppression region 50 may be formed by implanting species into the second surface 14 of the wafer 13. The species may be implanted into the new second surface 24 after removal of portions of the wafer 13 to expose portions of the insulating layer 19. This method is more easily carried out due to the reduced thickness t of the remaining portion of the base substrate 29 positioned the base of the mesa 15 compared to the initial thickness $t_w$ of the foreign wafer 13.

In some embodiments, the charge mobility reduction region is formed by implanting species, such as $Ar^+$ ions. The implanted species can comprise one selected from the group consisting of Ar, Kr, Xe, Ne, He, N, O, H, Fe, C, Si and Al. The implanted species may be ions In some embodiments, the species may be implanted at two or more different energies in order to increase the implantation depth and thickness of the charge mobility reduction region 50. In particular example, the species are Ar+ ions, which are implanted at an energy in the range of 20 keV to 250 keV with an implantation dose of $1e^{13}$ cm$^{-2}$ to $5e^{15}$ cm$^{-2}$ or $1e^{14}$ cm$^{-2}$ to $5e^{15}$ cm$^{-2}$. In one example, the species are implanted with an ion implantation dose of $3e^{14}$ cm$^{-2}$ at 50 keV and $3e^{14}$ cm$^{-2}$ at 250 keV.

In some embodiments, the charge mobility reduction region 50 is replaced by a charge density reduction region including charge traps. The charge mobility reduction regions may consist of regions of high trap density, where electrons or holes occupy the traps. In this case the number of electrons or holes available for current conduction is reduced. The resistance of the charge mobility reduction region 50 is increased due to a reduction in the density of free electrons or holes at the interface. In some embodiments, a combination of a high trap density and a polycrystalline structure or an amorphous or a high-defect density structure is used.

Epitaxial Group III nitride-based multilayer structures, such as those described above which are used for HEMTs, have large polarization charges and are epitaxially grown at high temperature. Consequently, the inclusion of a parasitic channel suppression region can be particularly beneficial for Group III nitride-based multilayer structures.

In order to reduce the RF losses and improve the efficiency of the device, in a first aspect, the present disclosure seeks to suppress the current flow in the parasitic channels by inhibiting the movement of electrons in these parasitic channels. This is achieved in some embodiments by providing a charge mobility reduction region at the boundary between the III V semiconductor material and the substrate. The parasitic electron channels are thought to still exit and be capacitively coupled to the drain electrode and the electrode on the rear surface of the substrate. However, the charge mobility reduction region prevents current flow through the parasitic electron channel so that RF losses do not arise.

The charge mobility reduction region may be a highly resistive region which may be formed by forming an amorphous or polycrystalline or high-defect density region at positions in which the parasitic electron channels are formed, for example at the boundary between the III V semiconductor layer and the substrate. The charge mobility reduction region can be formed by implantation and locally disrupt the crystallinity of the substrate and epitaxial Group III nitride layers. An increase in the drain efficiency of at least 4 to 5% points can be achieved. Drain efficiency is the ratio of (RF output power delivered to the load)/(DC power supplied to the transistor drain terminal).

In a second aspect, the present disclosure seeks to suppress the current flow in the parasitic channels by decreasing the charge density at the regions in which these parasitic channels are formed. This is achieved by providing a charge density reduction region at the boundary between the III V semiconductor layer and the substrate. The charge density reduction region may include traps for trapping the charge, thus preventing the formation of a parasitic conductive electron or hole channel.

The charge density reduction region may be an amorphous or polycrystalline or high-defect density region formed at positions in which the parasitic electron channels are formed, for example at the boundary between the III V semiconductor layer and the substrate. The charge density reduction region can be formed by implantation and to locally disrupt the crystallinity of the substrate and epitaxial Group III nitride layers and form charge traps in these regions.

In some embodiments, the parasitic channel suppression region may include a combination of a high trap density for reducing the charge density and a locally increased resistivity for reducing charge mobility.

FIG. 6 illustrates a cross-sectional view of a portion of a semiconductor wafer 10 according to an embodiment. In the embodiment illustrated in FIG. 6, at least one cavity 60 is arranged on the first surface 12 of the foreign wafer 13 laterally adjacent to the mesa 15. The cavity 60 is formed and defined by one or more insulating layers 61 and is filled with a gas or vacuum. For example, the cavity 60 can be defined by insulating layers 61 arranged on the side faces 16 of adjacent mesas 15 and the side faces 26 of the base substrate 29 if present and the first surface 12 of the foreign wafer 13 arranged between neighbouring mesas 15 in the non-device regions. This lined recess may be capped by a further insulating layer 62 to seal and close the cavity 60. The cavity 60 may be filled by a gas or vacuum which may be the same or similar to the gas or vacuum present in the apparatus used to deposit the cap 62. In the embodiment illustrated in FIG. 6, the wafer 10 includes a cavity 60 in place of the insulating material 19. The cavity 60 may form part of the final semiconductor device.

FIG. 6 also illustrates an embodiment of a III-V semiconductor layer 11 which includes a multilayer Group III nitride structure 70 that is epitaxially grown on the first surface 31.

The multilayer Group III nitride structure 70 may be used as the III-V semiconductor layer 11 in any one of the embodiments described with reference to FIGS. 1a to 5.

The multilayer Group III nitride-based structure 70 may include a Group III nitride buffer structure 71 which is grown on the first surface 12 of the foreign wafer 13, a Group III nitride channel layer 72 which is grown on the Group III nitride buffer structure 71 and a Group III nitride barrier layer 73 which is grown on the Group III nitride channel layer 72. The Group III nitride barrier layer 73 may include aluminium gallium nitride and the Group III nitride channel layer 72 may include gallium nitride such that a heterojunction 74 is formed between the Group III nitride channel layer 72 and the Group III nitride barrier layer 73 which is capable of supporting a two-dimensional charge gas, e.g., a two-dimensional electron gas (2DEG) or a two dimensional hole gas (2DHG).

The Group III nitride-based buffer structure 70 for a silicon substrate may include an AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 5-15 nm. Depending on the desired breakdown voltage the superlattice may include between 20 and 100 pairs. Alternatively, an $Al_xGa_{(1-x)}N$ layer sequence as described above can be used in combination with the above mentioned superlattice.

In some non-illustrated embodiments, a conductive electrode may be arranged on the second surface 28 of the mesa 15 or on the base substrate 29, if present. The conductive electrode may be coupled to ground potential.

As discussed above, a semiconductor device fabricated from the wafer according to any one of the embodiments described above may include a single mesa 15 so that the single mesa 15 provides a transistor device or may include a plurality of mesas 15 which are electrically coupled together by a conductive redistribution structure or metallization structure to form a single transistor device.

Figure 7:
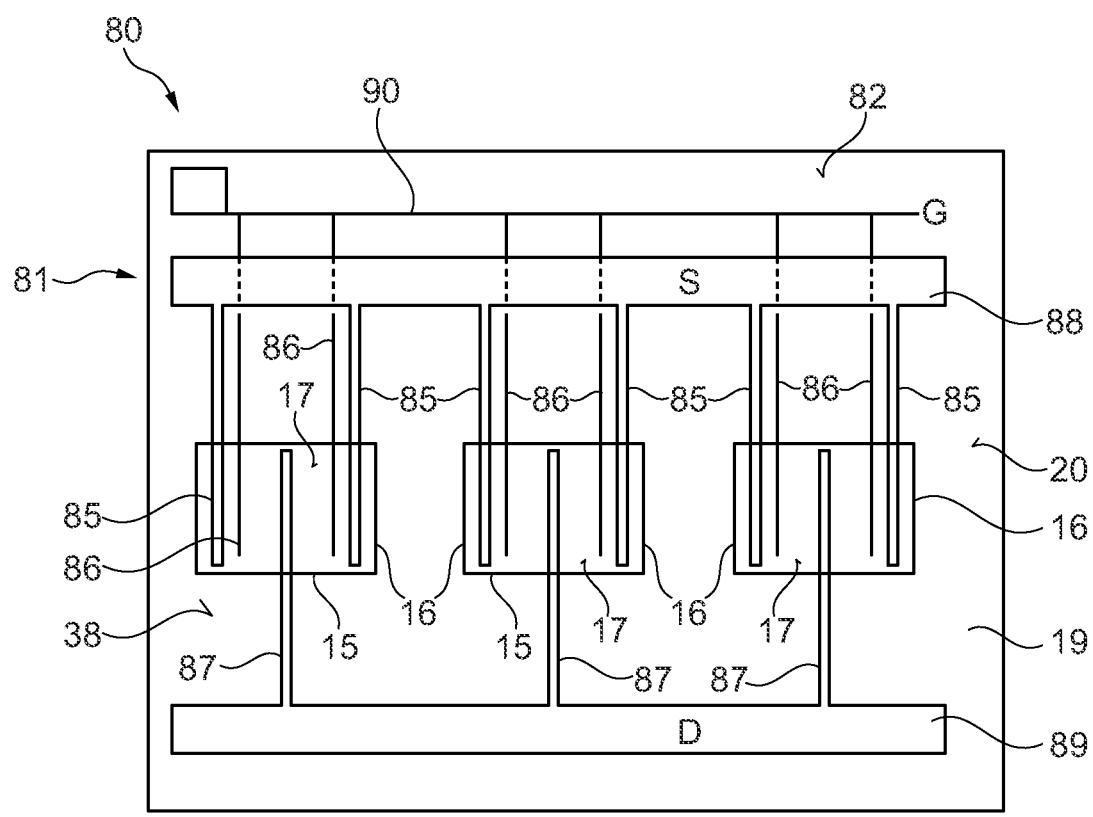
FIG. 7 illustrates a top view of a semiconductor device according to an embodiment.

FIG. 7 illustrates a top view of a semiconductor device 80 according to an embodiment. The semiconductor device 80 may be fabricated using the method according to any one of the embodiments described herein.

The semiconductor device 80 includes a plurality of the mesas 15 and the insulation layer 19 that provides an insulating matrix 19 of the semiconductor device 80. Side faces 16 of the mesas 15 are embedded in the insulating matrix 19 and the top surface 17 of the mesas 15 is substantially coplanar with the upper surface 20 of the insulating matrix 19. Each of the mesas 15 may comprise a III-V semiconductor, such as Group III nitride, and may include an epitaxial Group III nitride-based multilayer structure, for example the structure described with reference to FIG. 6. The mesas 15 are spaced apart and electrically insulated from one another by the insulating layer 19 that provides the insulating matrix of the semiconductor device 80.

The mesas 15 may be arranged in a single row or two or more rows. The mesas may also be arranged in an array, for example or rows and columns.

The semiconductor device 80 comprises a metallization structure 81 which is positioned on the upper surface 82 of the semiconductor device 80. The upper surface 82 of the semiconductor device 80 is provided by the upper surface 20 of the insulating layer 19 providing the insulating matrix 19 and the top surface 17 of the mesas 15.

The metallization structure 81 includes a source finger 85, a gate finger 86 and a drain finger 87 arranged on the top surface 17 of each mesa 15. The source fingers 85, gate fingers 86 and drain fingers 87 may be formed of one or more metallic layers and each have an elongate strip-like form. The source fingers 85, the gate fingers 86 and the drain fingers 87 extend substantially parallel to one another. On each mesa 15, the gate finger 86 is positioned laterally between the source finger 85 and the drain finger 87. The metallization structure 81 further includes a source bus 88 which electrically couples the source fingers 85 arranged on two or more, or all of the mesas 15 to one another. The metallization structure 81 also includes a drain bus 89 which electrically couples two or more, or all of the drain fingers 87 to one another and a gate bus or gate runner 90 which electrically couples two or more, or all of the gate fingers 86 to one another.

The metallization structure 81 electrically couples the mesas 15 together so that two or more mesas 15 form a single switch or transistor device.

The source bus 88 is positioned on the upper surface 20 of the insulating layer 19 at a position laterally adjacent to and spaced apart from a side face of the mesas 15. Each source finger 85 is arranged not only on the top surface 17 of the mesa 15 but also extends over the upper surface 20 of the insulating matrix 19 to the source bus 88. The source bus 88 may extend substantially perpendicularly to the source fingers 85. Each drain finger 87 is also positioned on the top surface 17 of the mesas 15 and on upper surface 20 of the insulating matrix 19 and extends to the drain bus 89 which is positioned on the upper surface 20 of the insulating matrix 19 at a position laterally adjacent and spaced apart from a side face 16 of the mesas 15. The drain bus 89 may be positioned on the opposing side of the mesas 15 to the source bus 88 so that the source fingers 85 and drain fingers 86 extend from the mesas 15 onto the insulating matrix 19 in opposing directions.

Each gate finger 86 is also positioned on the top surface 17 of the mesa 15 and an upper surface 20 of the insulating matrix 19 and extends to the gate bus 90. The gate bus 90 may be positioned laterally adjacent the source bus 88 and may extend substantially parallel to the source bus 88. Typically, the gate fingers 86 and gate bus 90 have a smaller thickness than the source fingers 86 and are covered with further insulating layer of the metallization structure 81 (not seen in the top view of FIG. 7) such that the gate fingers 86 extend under and are electrically insulated from the source bus 88 by this additional insulating layer.

In some embodiments, more than three fingers are arranged on each mesa 15. In some embodiments, the fingers have a symmetrical arrangement on each of the mesas 15. In the embodiment illustrated in FIG. 7, the five fingers are arranged on each mesa 15 and have the arrangement source gate drain gate source. However, an arrangement of drain gate source gate drain may also be used. The arrangement of the fingers on each of the mesas 15 of a semiconductor device may be the same or may differ.

In some embodiments, the mesas 15 may each include a support layer such that the lower surface of the semiconductor device 80 includes a plurality of islands of the material of the support layer laterally surrounded by the material of the insulating matrix 19. In some embodiments, the semiconductor device 80 also includes a parasitic channel suppression region at the interface between III-V semiconductor and the first surface of the support substrate according to any one of the embodiments described herein.

In some embodiments, the lower surface of the semiconductor device 80 includes islands of the III-V semiconductor material forming the mesas 15 which are laterally surrounded by the material of the insulating matrix 19. In these embodiments, the mesas 15 are not positioned on a support layer.

Figure 8A:
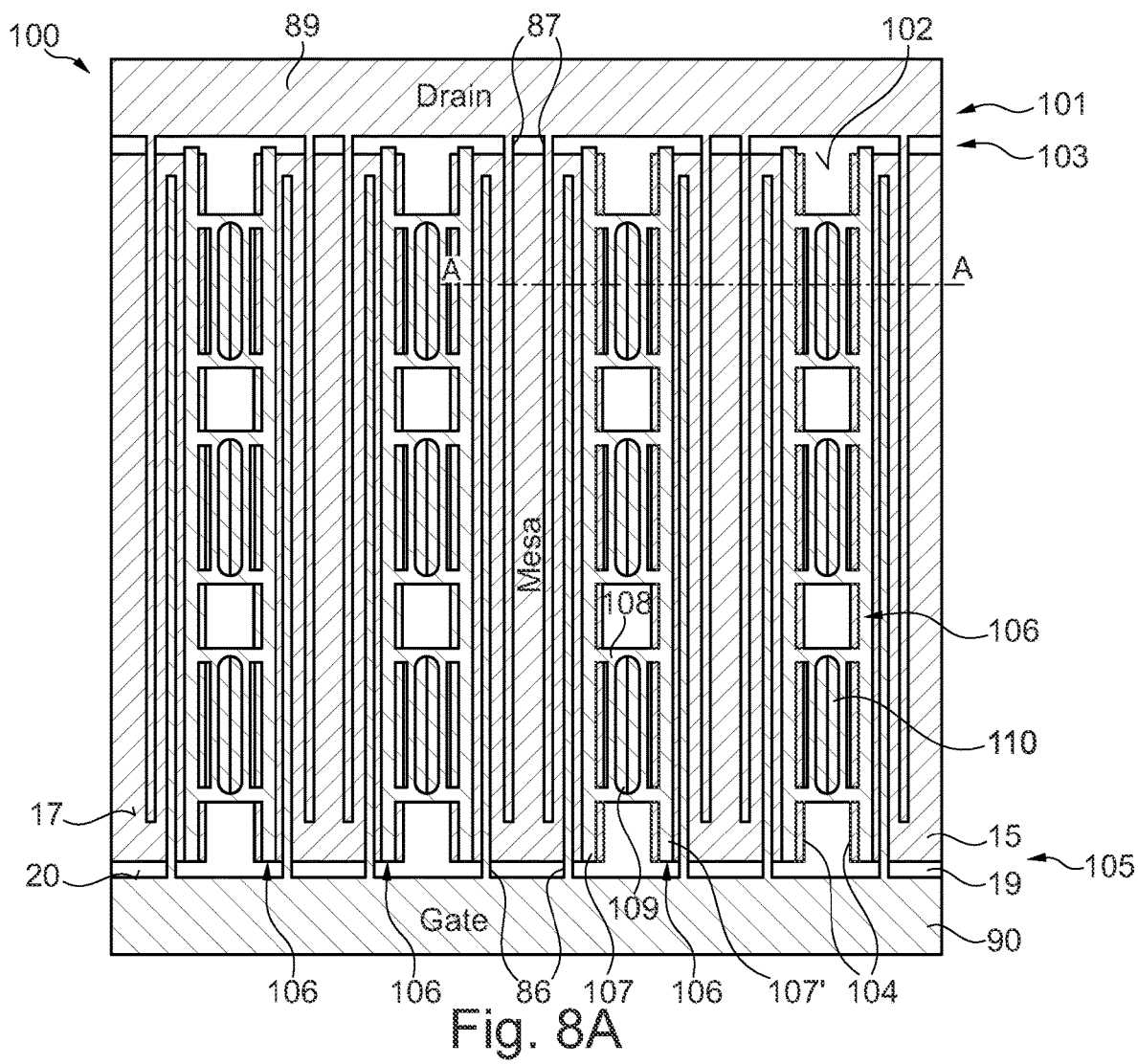
FIG. 8A illustrates a top view of a semiconductor device according to an embodiment.
Figure 8B:
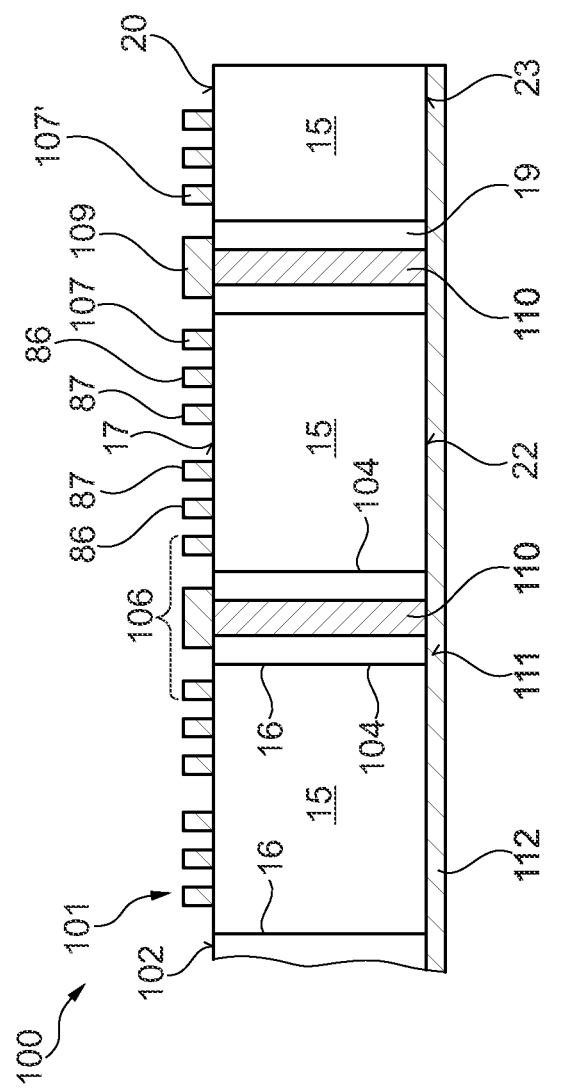
FIG. 8B illustrates a cross-sectional view along the line A-A of FIG. 8A.

FIG. 8A illustrates a top view of a semiconductor device 100 according to an embodiment and FIG. 8B illustrates a cross-sectional view of the semiconductor device 100 along the line A-A indicated in FIG. 8A. The semiconductor device 100 may be fabricated using the method according to any one of the embodiments described herein.

The semiconductor device 100 includes a plurality of mesas 15 embedded in an insulating layer 19 that provides an insulating matrix of the semiconductor device 100. In this embodiment, the rear surface 111 of the semiconductor device is formed by the coplanar lower surface 23 of the insulating layer 19 and the lower surface 22 of the mesa 15.

The side faces 16 of the mesas 15 are embedded in the insulating matrix 19 and the top surfaces 17 of the mesas 15 are substantially coplanar with the upper surface 20 of the insulating matrix 19 as in the embodiment illustrated in FIG. 7. In this embodiment, each of the mesas 15 has an elongate strip type form and the plurality of mesas 15 are arranged in a single row with the long sides of the mesas extending substantially parallel to one another.

The semiconductor device 100 includes a metallization structure 101 which is positioned on the upper surface 102 of the semiconductor device 100. The upper surface 102 of the semiconductor device 100 is provided by the upper surface 20 of the insulating layer and the top surface 17 of the mesas 15. The metallization structure 101 electrically couples the mesas 15 together so that a plurality of mesas forms a single switch or transistor device. The metallization structure 101 differs in its layout from the metallization structure 81 of the semiconductor device 80.

The metallization structure 101 includes two drain fingers 87 positioned on each of the mesas 15 which extend to and are electrically coupled together by a drain bus 89 which extends substantially perpendicularly to the length of the drain fingers 87 and which is positioned laterally adjacent first side 103 of the mesas 15 on the upper surface 20 of the insulating matrix 19. The drain fingers 87 are positioned towards the centre of the top surface 17 of each of the mesas 15. Two gate fingers 86 also positioned on the top surface 17 of each mesa 15 such that they are positioned between drain finger 87 and a longitudinal side edge 104 of the mesa 15. The gate fingers 86 are electrically coupled together by a gate bus 90 which extends substantially perpendicular to the length of the gate fingers 86. In this embodiment, the gate bus 90 is positioned adjacent second side 105 of mesas 15 which opposes the first side 103 of the mesas 15 adjacent which the drain bus 89 is positioned.

In place of a single source bus, the metallization structure 101 includes a plurality of source regions 106, each extending between two adjacent ones of the mesas 15 that form a pair. The source regions 106 may each be formed of a conductive layer, for example, a metallic layer that may comprise one or more sublayers. Each of the source regions 106 has an elongate longitudinal portion 107 that is positioned on each of two immediately adjacent mesas 15 adjacent the gate finger 86 so that the gate finger 86 is positioned laterally between the drain finger 87 and the longitudinal portion 107. The longitudinal portion 107 extends substantially parallel to the gate finger 86 and drain finger 87 and can be considered to provide a source finger.

The longitudinal portions 107, 107' are electrically coupled by a plurality of transverse portions 108 which extend over the intervening portion of the insulating matrix 19. In the embodiment illustrated in FIGS. 8a and 8b, neighbouring ones of the transverse portions 108 are electrically coupled by a longitudinal connection portion 109 which is positioned entirely on the insulating matrix 19. In the embodiment illustrated in FIGS. 8a and 8b, a plurality of these structures is positioned between the long side faces 104 of the pair of mesas 15. However, in other embodiments, a single source region 106 having a substantially rectangular shape which extends between each pair of mesas 15 or a plurality of source regions 106, each having a substantially rectangular shape and each extending between a pair of mesas 15 may be used The source region 106 is electrically coupled to the rear surface of the semiconductor device 100 by one or more conductive source vias 110. The source vias 110 are positioned between the mesas 15 and extend through the insulating matrix 19. The source vias 110 may be laterally completely surrounded by the insulating matrix 19 and not extend through the III-V semiconductor material of the mesas 15 or through any support substrate that, in some embodiments, is positioned under the mesas 15.

One or more source vias 110 may be positioned under each of the longitudinal connection portions 109, for example. The source vias 110 may each have an elongate shape and extend substantially parallel to the long sides 104 of the mesas 15 or may have, for example, a circular, square of hexagonal shape in plan view.

The rear surface 111 of the semiconductor device 100 may include a metallic layer 112 which extends continuously and uninterruptedly over the entire rear surface 111 such that each of the source regions 106 is connected to a common source connection on the rear surface 111 of the semiconductor device 100. In other embodiments, the metallic layer 112 on the rear surface 111 of the semiconductor device 100 includes a plurality of discrete portions which are spaced apart from one another. One of the source regions 106 may be connected to a single one of the discrete portions. Two or more of the source regions 106 may, however, be connected to a common one of the discrete portions.

Figure 9:
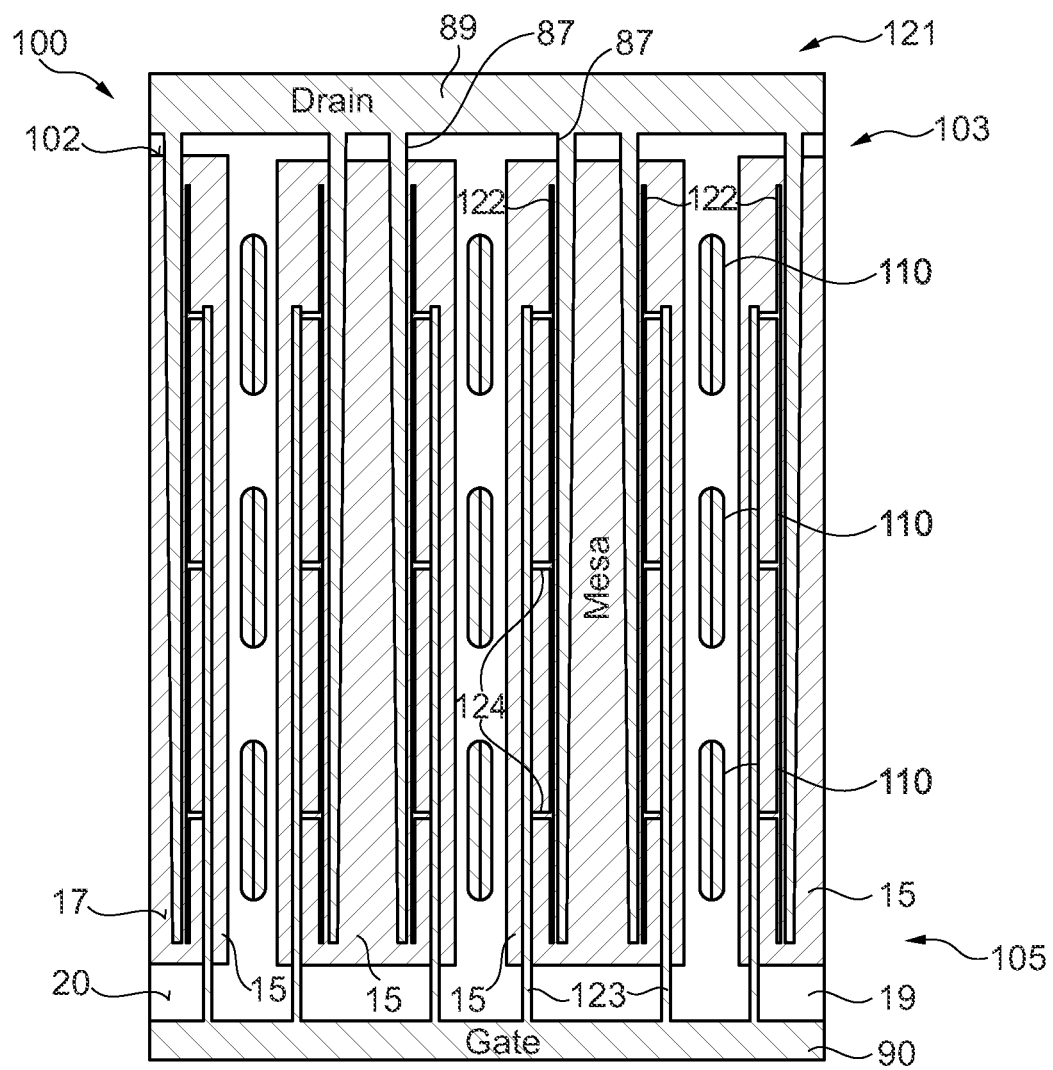
FIG. 9 illustrates a top view of a semiconductor device according to an embodiment.

FIG. 9 illustrates a top view of a semiconductor device 120 according to an embodiment which has a plurality of elongate mesas 15 embedded in an insulating matrix 19 as in the embodiment illustrated in FIGS. 8a and 8b. The semiconductor device 120 has a metallization structure 121 having a similar layout to the metallization structure 101 with a drain bus 89 positioned adjacent a first side 103 and a gate bus 90 positioned against the opposing side 105 of the mesas 15. The metallization structure 121 also includes a plurality of source regions 106 each positioned between and extending between a pair of mesas 15. Each source region 106 is electrically coupled to the rear surface of the semiconductor device 120 by a plurality of source vias 110 which are positioned between the pair of mesas 15 in the insulating matrix 19. The source region 106 is not seen in the top view of FIG. 10 in order that the arrangement of the gate fingers 86 can be more clearly seen.

In the embodiment illustrated in FIG. 9, the gate fingers 86 include a first longitudinal portion 122 which extends parallel to the drain finger 87 and which has a length such that it is positioned entirely on the top surface 17 of the mesa 15. The gate bus 90 is electrically coupled to the first longitudinal portion 122 of the gate finger 86 by a second longitudinal portion 123 which extends from the gate bus 90 over the upper surface 20 of the insulating matrix 19 and onto the top surface 17 of the mesa 15. The second longitudinal portion 123 extends substantially parallel to the drain finger 87 and to the first longitudinal portion 122 of the gate bus 86. The second longitudinal portion 123 is laterally spaced apart in the transverse direction from the longitudinal portion 122. The second longitudinal portion 123 is electrically coupled to the first longitudinal portion 122 by one or more transverse portions 124. In this embodiment, a plurality of transverse portions 124 are positioned at intervals along the length of the longitudinal portions 122, 123. The first longitudinal portion 122 is positioned laterally between the second longitudinal portion 123 and the drain finger 87.

The second longitudinal portion 123 provides a redistribution structure from the gate bus 90 to the first longitudinal portion 122 which provides the gate finger 86.

Figure 10:
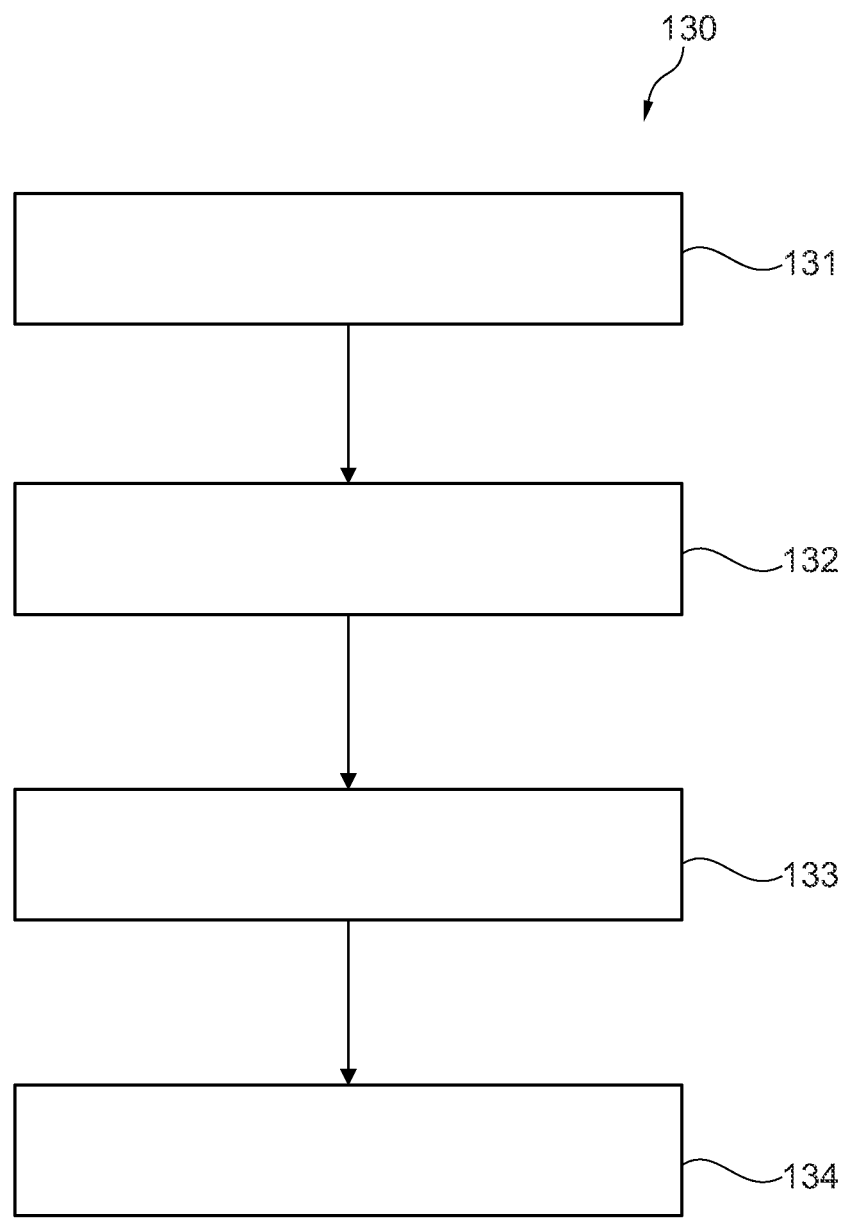
FIG. 10 illustrates a flowchart of a method for fabricating a semiconductor wafer according to an embodiment.

FIG. 10 illustrates a flowchart 130 of a method for fabricating a semiconductor wafer according to an embodiment.

In block 131, a III-V semiconductor is epitaxially grown on a first surface of a foreign wafer having a thickness $t_w$, the first surface being capable of supporting the epitaxial growth of at least one III-V semiconductor layer, the foreign wafer having a second surface opposing the first surface. In block 132, portions of the III-V semiconductor are removed to produce a plurality of mesas comprising the III-V semiconductor arranged on the first surface of the wafer. In block 133, an insulation layer is applied to regions of the wafer arranged between the mesas. In block 134, portions of the second surface of the wafer are progressively removed and the insulation layer in regions adjacent the mesas is exposed, thus producing a worked second surface.

Optionally, after removing portions of the III-V semiconductor are removed to produce a plurality of mesas comprising the III-V semiconductor arranged on the first surface of the wafer, portions of the first surface of the wafer are removed to form a worked first surface in regions laterally adjacent the mesas and an interface between the first surface of the wafer and the III-V semiconductor structure is formed that extends across the width of the mesa. Optionally, the progressively removing portions of the second surface of the wafer comprises reducing the thickness $t_w$ of the wafer under the mesa to a thickness t, wherein t≤20 µm, or t≤2 µm or t≤1 µm.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor wafer, the method comprising:
   epitaxially growing a III-V semiconductor on a first surface of a foreign wafer having a thickness $t_w$, the first surface being capable of supporting the epitaxial growth of at least one III-V semiconductor layer, the foreign wafer having a second surface opposing the first surface;
   removing portions of the III-V semiconductor to produce a plurality of mesas comprising the III-V semiconductor arranged on the first surface of the foreign wafer;
   applying an insulation layer to regions of the foreign wafer arranged between the mesas; and
   progressively removing portions of the second surface of the foreign wafer, exposing the insulation layer in regions adjacent the mesas and producing a worked second surface,
   wherein the applying an insulation layer comprises:
     depositing the insulation layer onto the mesa and regions between the mesas such that the insulation layer has a thickness that is at least as great as a height of the mesas and the mesas are covered with the insulation layer; and
     planarising the insulation layer and forming a planarised surface comprising an upper surface of the mesa and an upper surface of the insulation layer.

2. The method of claim 1, further comprising:
   removing portions of the first surface of the foreign wafer to form a worked first surface in regions laterally adjacent the mesa and to form an interface between the first surface of the foreign wafer and the III-V semiconductor structure that extends across the width of the mesa.

3. The method of claim 1, wherein the progressively removing portions of the second surface of the foreign wafer comprises reducing the thickness $t_w$ of the foreign wafer under the mesa to a thickness t, and wherein t≤20 µm, or t≤2 µm or t≤1 µm.

4. The method of claim 1, wherein the removing portions of the second surface of the foreign wafer comprises at least one selected from the group consisting of grinding, polishing, chemical mechanical polishing and etching the second surface of the foreign wafer.

5. The method of claim 1, further comprising:
   forming a structured mask on the insulation layer having an opening above the mesa, the opening having a lateral area smaller than a lateral area of the mesa;
   removing a portion of the insulation layer within the opening and reducing a thickness of the portion of the insulation layer arranged above the mesa; and
   progressively removing the mask and portions of the insulation layer to produce the planarised surface comprising the upper surface of the mesa and the upper surface of the insulation layer.

6. The method of claim 1, further comprising forming a stop layer on the regions of the foreign wafer arranged between the mesas, and wherein the removing portions of the second surface of the foreign wafer comprises exposing the stop layer in regions adjacent the mesas.

7. The method of claim 1, further comprising forming a metallization structure on the III-V semiconductor, the metallization structure providing a source, gate and drain for a transistor structure.

8. The method of claim 7, wherein the metallization structure comprises:
- a gate finger and a drain finger arranged on each mesa;
- a drain bus that electrically couples a first drain finger arranged on a first mesa with a second drain finger arranged on a second mesa, the drain bus being arranged laterally adjacent the first mesa and the second mesa at least partially on the insulating layer; and
- a gate bus that electrically couples a first gate finger arranged on the first mesa with a second gate finger arranged on a second mesa, the gate bus being arranged laterally adjacent the first mesa and the second mesa at least partially on the insulating layer.

9. The method of claim 8, wherein the metallization structure further comprises at least one source via positioned in the insulating layer between the first mesa and the second mesa, and wherein the at least one source via is electrically coupled to a source region that is arranged on the insulating layer and extends between the first mesa and the second mesa and is electrically coupled to a metallic layer on the worked second surface.

10. The method of claim 1, wherein the III-V semiconductor is a Group III nitride and the foreign wafer is monocrystalline silicon.

\* \* \* \* \*